United States Patent
Simonneau et al.

(10) Patent No.: US 7,869,686 B2
(45) Date of Patent: Jan. 11, 2011

(54) AMPLIFYING OPTICAL FIBER

(75) Inventors: Christian Simonneau, Villejuif (FR); Laurent Gasca, Villebon-sur-Yvette (FR); Stéphanie Blanchandin, Paris (FR); Dominique Bayart, Clamart (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 11/556,753

(22) Filed: Nov. 6, 2006

(65) Prior Publication Data

US 2007/0127877 A1 Jun. 7, 2007

(30) Foreign Application Priority Data

Nov. 8, 2005 (FR) .................................. 05 53374

(51) Int. Cl.
*G02B 6/00* (2006.01)
(52) U.S. Cl. .................. 385/141; 385/126; 385/127; 385/142; 359/341.1; 359/341.3
(58) Field of Classification Search ................ None
See application file for complete search history.

(56) References Cited

U.S. PATENT DOCUMENTS

| | | | |
|---|---|---|---|
| 5,291,501 A * | 3/1994 | Hanna | 372/6 |
| 5,881,200 A * | 3/1999 | Burt | 385/142 |
| 6,104,852 A * | 8/2000 | Kashyap | 385/123 |
| 7,120,340 B2 * | 10/2006 | Berkey et al. | 385/123 |
| 2002/0041736 A1 | 4/2002 | Locasclo | |
| 2002/0186921 A1 * | 12/2002 | Schumacher et al. | 385/31 |
| 2004/0196536 A1 * | 10/2004 | Bourova et al. | 359/341.1 |
| 2005/0063426 A1 | 3/2005 | Sparacin | |
| 2005/0111805 A1 | 5/2005 | Hertz | |
| 2006/0088261 A1 * | 4/2006 | Berkey et al. | 385/123 |
| 2006/0245710 A1 * | 11/2006 | Borrelli et al. | 385/129 |
| 2007/0183474 A1 * | 8/2007 | Spariosu et al. | 372/79 |

FOREIGN PATENT DOCUMENTS

CN  1 474 223  2/2004
EP  1 304 774 A1  4/2003

OTHER PUBLICATIONS

Evident Technologies,Quantum Dots Explained,2003,Internet http://www.evidenttech.com/qdot-definition/quantum-dot-introduction.php, p. 1.*
"Highly luminescent Eu3+ or Tb3+ doped and ZnO sensitized optical fibers drawn from silicon compatible sealing glasses", Applied Physics Letters, AIP, American Institute of Physics Letters, Melville, NY, US, vol. 69, No. 7, Aug. 12, 1996, pp. 892-894, XP012017171.

* cited by examiner

*Primary Examiner*—Uyen-Chau N Le
*Assistant Examiner*—Chad H Smith
(74) *Attorney, Agent, or Firm*—Sughrue Mion, PLLC

(57) ABSTRACT

The invention consists in an amplifying optical fiber comprising a core containing a dopant and a cladding, wherein said core comprises a monomode core intended to propagate an optical signal, quantum dots of a semiconductor material being disposed in or near said monomode core, and a multimode core surrounding the monomode core, intended to receive a pumping signal.

9 Claims, 1 Drawing Sheet

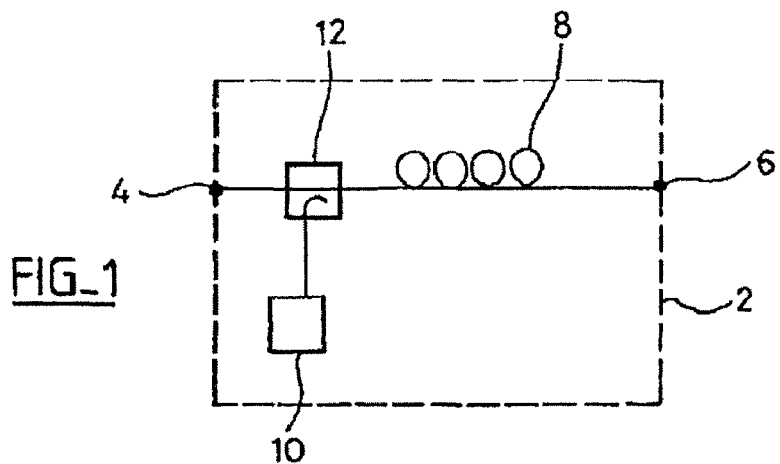
FIG_1
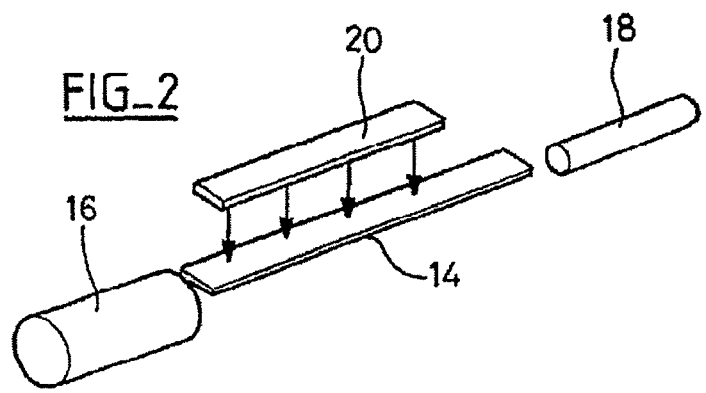
FIG_2
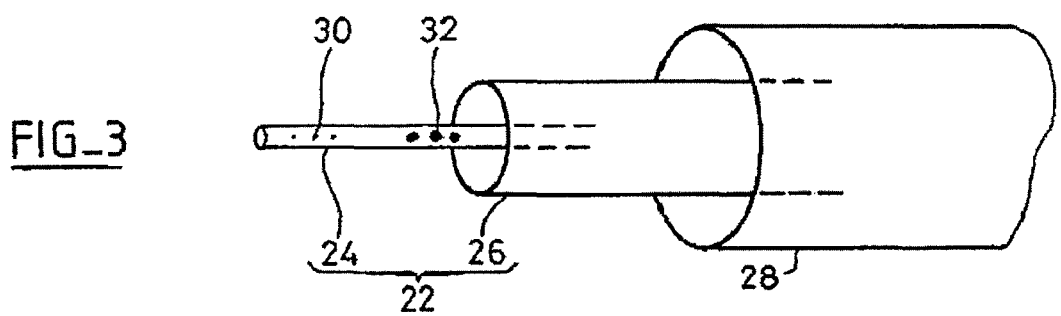
FIG_3
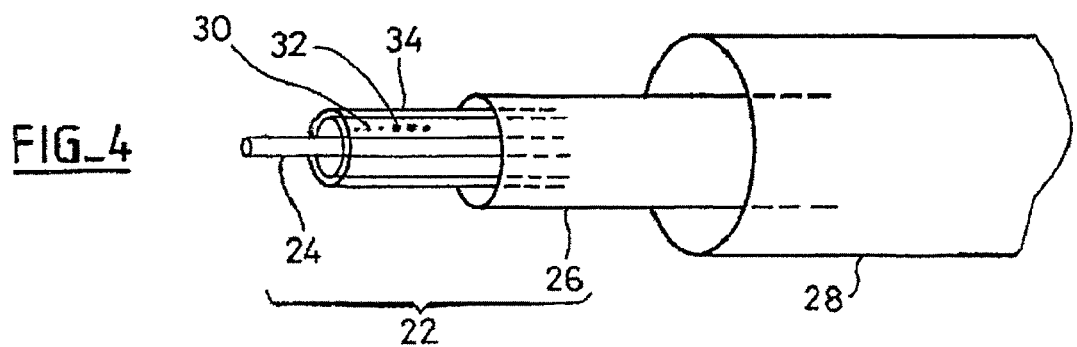
FIG_4

AMPLIFYING OPTICAL FIBER

CROSS-REFERENCE TO RELATED APPLICATIONS

This application is based on French Patent Aplication No. FR 0553374 filed Nov. 8, 2005, the disclosure of which is hereby incorporated by reference thereto in its entirety, and the priority of which is hereby claimed under 35 U.S.C §119.

BACKGROUND OF THE INVENTION

1. Field of the Invention

The present invention concerns the field of amplifying optical fibers and of optical fiber amplifiers.

2. Description of the Prior Art

There is represented diagrammatically in FIG. 1 an optical fiber amplifier. This amplifier 2 comprises an input port 4 and an output port 6 intended to be connected to a line fiber. The amplifier consists of a doped optical fiber 8, a pumping source 10 and an optical coupler 12. The pumping source is generally a laser and delivers a pumping optical signal that is injected into the doped fiber 8 by the optical coupler 12. This pumping optical signal is absorbed by the dopant, chosen from the rare earths and in particular erbium, present in the core of the doped optical fiber which, on becoming de-excited, transfers a portion of the absorbed energy to the optical signal propagating between the ports 4 and 6, thereby amplifying that optical signal.

The doped optical fiber may comprise a monomode core in which the dopant is found and into which the pumping optical signal is injected. It may also comprise a monomode core receiving the dopant and a multimode core surrounding the monomode core to receive the pumping signal. This second embodiment has the advantage of enabling the injection of a more powerful pumping signal and of producing better coupling between the pumping optical signal and the dopant.

Moreover, it is known that it is possible to choose the wavelength of the pumping signal by using quantum dots, and in particular by choosing the type of quantum dot and the size of the quantum dots, as indicated for example in the paper "Highly luminescent silicon nanocrystal with discrete optical transitions" J. D. Holmes et al., J. Am. Chem. Soc. 123 (2001) pp 3743-3748.

However, the quantum dots have a very large absorption section. Accordingly, in the case of a monomode optical fiber, the pumping signal is absorbed by the quantum dots over a length of fiber of the order of 50 µm. It is not possible with the current technology to insert a sufficient concentration of dopant over this short a distance, so that it is not possible to transfer the energy absorbed by the quantum dots to the dopant efficaciously.

To overcome this difficulty, there is proposed in the paper "Optical gain at 1.5 µm in nanocrystal Si sensitized, Er-doped silica waveguide using top-doping 470 nm LED", J. Lee et al, OFC'04, PD19 a device as represented in FIG. 2. That device includes a flat waveguide 14 including quantum dots of Si and a dopant Er placed between two line fiber elements 16 and 18 and a strip 20 of photodiodes. The strip 20 delivers a pumping signal 22 transversely to the flat waveguide, and so the pumping signal is injected over a sufficient length of the flat waveguide. The length of the flat waveguide is 11 mm in the example described.

This solution is not yet satisfactory, however. In fact, it is clear that the waveguide cannot be very long (its length is of the same order of magnitude as the length of the strip of photodiodes), so that it remains necessary to dope the waveguide strongly. This causes cooperation between the ions of the dopant, which greatly reduces the efficacy of the optical conversion and therefore the amplification of the optical signal to be amplified.

Moreover, a coupling loss cannot be avoided between a flat waveguide and a circular line fiber.

An object of the invention is to alleviate the drawbacks of the prior art in the case of an amplifying optical fiber comprising quantum dots.

SUMMARY OF THE INVENTION

More precisely, the invention consists in an amplifying optical fiber comprising a core containing a dopant and a cladding, characterized in that said core comprises a monomode core intended to propagate an optical signal, quantum dots of a semiconductor material being disposed in or near said monomode core, and a multimode core surrounding the monomode core, intended to receive a pumping signal.

Said semiconductor material quantum dots and/or said dopant are advantageously disposed in the monomode core.

In a preferred embodiment said semiconductor material quantum dots and/or said dopant are disposed in a ring around the monomode core.

The semiconductor material preferably comprises at least one of the materials Si, Ge, PbTe, PbS.

The invention also consists in an optical fiber amplifier comprising an amplifying fiber according to the invention, an optical pumping source, and means for injecting the pumping optical signal into the multimode core of the amplifying optical fiber.

The features and advantages of the invention will emerge more clearly from a reading of the following description, which is given by way of illustrative and nonlimiting example with reference to the appended figures.

BRIEF DESCRIPTION OF THE DRAWINGS

FIG. 1, already described, shows diagrammatically the structure of an optical fiber amplifier.

FIG. 2, already described, shows a prior art optical fiber amplifier including a doped waveguide containing quantum dots.

FIG. 3 shows a first embodiment of an amplified optical fiber according to the invention.

FIG. 4 shows a second embodiment of an amplified optical fiber according to the invention.

DETAILED DESCRIPTION OF PREFERRED EMBODIMENTS

There is represented in perspective in FIG. 3 an amplifying optical fiber according to a first embodiment of the invention. This optical fiber comprises a core 22, which is formed of a monomode core 24 surrounded by a multimode core 26, and a cladding 28.

The monomode core 24 comprises a dopant 30 for amplifying an optical signal propagating in the monomode core. The dopant may be of any known type, and in particular a rare earth, and in particular erbium. The monomode core also comprises quantum dots 32 of a semiconductor material.

The multimode core 26 is intended to receive a pumping optical signal. Thus, in contrast to the prior art represented in FIG. 2, the invention enables the pumping signal to propagate over a great distance before being absorbed by the quantum dots 32. The absorption of the pumping signal in the multimode core is inversely proportional to the diameter of the multimode core. The fact of providing a greater length for the absorption of the pumping optical signal enables distribution of the dopant over a greater distance and therefore reduction of the concentration thereof.

In one advantageous embodiment of the invention, the semiconductor quantum dots are formed of silicon and the dopant is a rare earth (for example erbium) ion. The monomode core has a diameter of 4 µm and the multimode core has a diameter of 400 µm. The pumping wavelength is chosen so that the effective section of the semiconductor quantum dots at the pumping wavelength is less than or equal to 100 times the effective absorption section of the rare earth ions. This wavelength therefore depends on the size and the nature of the semiconductor quantum dot. An advantageous size of silicon quantum dots is around 3 nm diameter (excluding the oxide layer). This size exalts the transfer of energy between the quantum dot and the rare earth ion at the same time as minimizing the losses by diffusion of these quantum dots. However, the size of the quantum dots may advantageously be situated in the range 2 nm-5 nm. In the case of silicon quantum dots of 3 nm diameter, the pumping wavelength may advantageously be from 400 nm to 500 nm. In this embodiment, it is preferable for the concentration of erbium ions not to exceed $7.10^{18}$ ions/cm$^3$ so as to limit the effects of cooperation between ions and to maintain good conversion efficiency. In this case, the typical length of a fiber would be 7 m to obtain a gain of 21 dB.

The quantum dots are chosen as a function of the target application. In particular the material used and the size of the quantum dots are chosen as a function of the selected wavelength of the pumping signal.

For example, the semiconductor material of the quantum dots is chosen from at least one of the following materials: Si, Ge, PbTe, PbS.

There is represented in FIG. 4 an amplifying optical fiber according to a second embodiment of the invention. Elements identical to those in FIG. 3 carry identical reference numbers.

The FIG. 4 embodiment differs from that of FIG. 3 in that the particles 30 of dopant and the semiconductor material quantum dots 32 are disposed in a ring 34 around the monomode core 24.

This embodiment reduces the size of the multimode core. Thus if the position and the size of the ring are such that the integral of the overlap between the monomode signal and the doped area is reduced by a factor of 3.33 relative to the doping in the core, the diffusion losses are reduced by a factor of 3.33. Moreover, the diameter of the multimode core may be reduced by a factor of 10 compared to the previous situation. In this embodiment, the diameter of the multimode core is therefore 40 µm and the length of the fiber is of the order of 70 m.

This arrangement also reduces the losses caused by diffusion generated by the quantum dots. In fact, the refractive index of the quantum dots is generally much higher than that of the material of the optical fiber (generally silica), which causes Mie diffusion increasing with the size of the quantum dots. Mie diffusion refers to the diffusion by particles the radius whereof oscillates between 0.1 and 10 times the wavelength. Note that the diffused power is at a maximum when the wavelength is close to the radius of the particle. Contrary to the Rayleigh theorem, the backscattered power is greater than the power diffused in the direction of the incident wave. If the quantum dots are in a ring around the monomode core, only the edge of the field interacts with the quantum dots, which reduces the losses. In fact, the lower the integral of the overlap between the field and the source of diffusion (here the quantum dots), the lower the losses by diffusion.

The amplifying fiber according to the invention is intended to be associated with a pumping source, such as the source 10, and means, such as the means 12, for injecting the pumping signal into the multimode core to form an optical fiber amplifier having a structure as represented in FIG. 1.

There is claimed:

1. An amplifying optical fiber comprising a core and a cladding, wherein the core comprises:
   a monomode core comprising a dopant and quantum dots, and propagating an optical signal; and
   a multimode core surrounding the monomode core, and receiving a pumping signal,
   wherein the dopant is provided for coupling with the pumping signal to amplify the optical signal, and the quantum dots are used for selecting a wavelength of the pumping signal, and
   wherein a diameter of the quantum dots is in a range between 2 nm and 5 nm.

2. The optical fiber according to claim 1, wherein the quantum dots are formed of a semiconductor material.

3. The amplifying optical fiber according to claim 2, wherein the semiconductor material comprises at least one of the materials Si, Ge, PbTe, PbS.

4. The amplifying optical fiber according to claim 1, wherein the dopant is a rare earth.

5. An optical fiber amplifier comprising
   an amplifying fiber comprising a core and a cladding, wherein the core comprises:
      a monomode core comprising a dopant and quantum dots, propagating an optical signal; and
      a multimode core provided around the monomode core and receiving a pumping signal,
   an optical pumping source generating the pumping signal, and means for injecting the pumping signal into the multimode core of the amplifying optical fiber,
   wherein the dopant is coupled with the pumping signal and amplifies the optical signal, and a wavelength of the pumping signal is determined based on a characteristic of the quantum dots, and
   wherein the optical pumping source is configured to generate the pumping signal having the wavelength such that an effective length of a section of the quantum dots absorbing the pumping signal in the monomode core at the wavelength of the pumping signal is less than or equal to 100 times an effective length of a section of the dopant absorbing the pumping signal in the monomode core.

6. The optical fiber amplifier according to claim 5, wherein a diameter of the quantum dots is in a range between 2 nm and 5 nm.

7. The optical fiber according to claim 1, wherein a diameter of the multimode core is approximately 100 times greater than a diameter of the monomode core.

8. The optical fiber amplifier according to claim 5, wherein a diameter of the multimode core is approximately 100 times greater than a diameter of the monomode core.

9. The optical fiber according to claim 5, wherein the quantum dots are formed of a semiconductor material.

* * * * *